United States Patent
Dieckmann et al.

(10) Patent No.: US 6,345,372 B1
(45) Date of Patent: Feb. 5, 2002

(54) METHOD FOR TESTING BUS CONNECTIONS OF WRITABLE AND READABLE INTEGRATED ELECTRONIC CIRCUITS, IN PARTICULAR MEMORY COMPONENTS

(75) Inventors: Andreas Dieckmann, Pyrbaum/Pruppach; Markus Donderer, Karlsruhe, both of (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 09/547,683

(22) Filed: Apr. 12, 2000

Related U.S. Application Data

(63) Continuation of application No. PCT/EP98/06673, filed on Oct. 21, 1998.

(30) Foreign Application Priority Data

Nov. 3, 1997 (EP) ............................................. 97119180

(51) Int. Cl.$^7$ ................................................ G11C 29/00
(52) U.S. Cl. ..................... 714/720; 714/718; 714/719; 714/42; 714/25
(58) Field of Search ............................... 714/720, 719, 714/718, 42, 43, 25

(56) References Cited

U.S. PATENT DOCUMENTS 5,541,942 A * 7/1996 Strouss ....................... 714/720
5,668,816 A * 9/1997 Douskey et al. ............ 714/720

OTHER PUBLICATIONS

Frans de Jong et al: "Memory Interconnection Test at Board Level", International Test Conference 1992, paper 17.1, pp. 328–337.

"Serial Interfacing for Embedded–Memory Testing" (Nadeau–Dostie et al.), 8291 IEEE Design & Test of Computers, No. 2, Apr. 1990, pp. 52–63.

"My Memory is not what it used to be: Testing RAMs and ROMs", 2119 EDN–Electrical Design News, No. 3, Feb. 1996, pp. 153–160.

"Built–In Self Diagnosis for Repairable Embedded RAMs", IEEE Design & Test of Computers, No. 2, Jun. 1993, pp. 24–33.

"Self–Diagnosis Architectures of Selected Circuit Blocks", pp. 220–225.

* cited by examiner

Primary Examiner—Andrew Q. Tran
(74) Attorney, Agent, or Firm—Herbert L. Lerner; Laurence A. Greenberg; Werner H. Stemer

(57) ABSTRACT

A method for testing bus connections of electronic circuits, in particular memory components, selects address and data bit test patterns such that, in a first step of write and read steps, respectively, the bits in the address bit test pattern have a first binary value and, in the first step of write steps, the bits in the data bit test pattern have a second value and, for each following step, starting with the lowest-value or highest-value bit, the respective adjacent bit is assigned a binary value which is complementary to that in the preceding step until, in the final step, all the bits in the address or data bit test pattern have a complementary value.

5 Claims, 11 Drawing Sheets

| | Address Bus | | | | Data Bus | | | |
|---|---|---|---|---|---|---|---|---|
| | A3 | A2 | A1 | A0 | D3 | D2 | D1 | D0 |
| Step : t0 (write) | 0 | 0 | 0 | 0 | 0 | 0 | 0 | 0 |
| Step : t1 (write) | 0 | 0 | 0 | 1 | 0 | 0 | 0 | 1 |
| Step : t2 (write) | 0 | 0 | 1 | 1 | 0 | 0 | 1 | 1 |
| Step : t3 (write) | 0 | 1 | 1 | 1 | 0 | 1 | 1 | 1 |
| Step : t4 (write) | 1 | 1 | 1 | 1 | 1 | 1 | 1 | 1 |
| Step : t5 (read) | 0 | 0 | 0 | 0 | 0 | 0 | 0 | 0 |
| Step : t6 (read) | 0 | 0 | 0 | 1 | 0 | 0 | 0 | 1 |
| Step : t7 (read) | 0 | 0 | 1 | 1 | 0 | 0 | 1 | 1 |
| Step : t8 (read) | 0 | 1 | 1 | 1 | 0 | 1 | 1 | 1 |
| Step : t9 (read) | 1 | 1 | 1 | 1 | 1 | 1 | 1 | 1 |
| Step : t10 (write) | 0 | 0 | 0 | 1 | 1 | 1 | 1 | 0 |
| Step : t11 (read) | 0 | 0 | 0 | 1 | 1 | 1 | 1 | 0 |

"Good Case" Example 1

|  | Address Bus | | | | Data Bus | | | |
|---|---|---|---|---|---|---|---|---|
|  | A3 | A2 | A1 | A0 | D3 | D2 | D1 | D0 |
| Step : t0  (write) | 0 | 0 | 0 | 0 | 0 | 0 | 0 | 0 |
| Step : t1  (write) | 0 | 0 | 0 | 1 | 0 | 0 | 0 | 1 |
| Step : t2  (write) | 0 | 0 | 1 | 1 | 0 | 0 | 1 | 1 |
| Step : t3  (write) | 0 | 1 | 1 | 1 | 0 | 1 | 1 | 1 |
| Step : t4  (write) | 1 | 1 | 1 | 1 | 1 | 1 | 1 | 1 |
| Step : t5  (read) | 0 | 0 | 0 | 0 | 0 | 0 | 0 | 0 |
| Step : t6  (read) | 0 | 0 | 0 | 1 | 0 | 0 | 0 | 1 |
| Step : t7  (read) | 0 | 0 | 1 | 1 | 0 | 0 | 1 | 1 |
| Step : t8  (read) | 0 | 1 | 1 | 1 | 0 | 1 | 1 | 1 |
| Step : t9  (read) | 1 | 1 | 1 | 1 | 1 | 1 | 1 | 1 |
| Step : t10 (write) | 0 | 0 | 0 | 1 | 1 | 1 | 1 | 0 |
| Step : t11 (read) | 0 | 0 | 0 | 1 | 1 | 1 | 1 | 0 |

"Good Case" Example 1

Fig. 1

Fig. 2 — Address Bus

| | A3 | A2 | A1 | A0 |
|---|---|---|---|---|
| Step t0 | 0 | 0 | 0 | 0 |
| Step t1 | 0 | 0 | 0 | 1 |
| Step t2 | 0 | 0 | 1 | 1 |
| Step t3 | 0 | 1 | 1 | 1 |
| Step t4 | 1 | 1 | 1 | 1 |

Fig. 3

| | A3 | A2 | A1 | A0 |
|---|---|---|---|---|
| Step t0 | 1 | 1 | 1 | 1 |
| Step t1 | 1 | 1 | 1 | 0 |
| Step t2 | 1 | 1 | 0 | 0 |
| Step t3 | 1 | 0 | 0 | 0 |
| Step t4 | 0 | 0 | 0 | 0 |

Fig. 4

| | A3 | A2 | A1 | A0 |
|---|---|---|---|---|
| Step t0 | 0 | 0 | 0 | 0 |
| Step t1 | 1 | 0 | 0 | 0 |
| Step t2 | 1 | 1 | 0 | 0 |
| Step t3 | 1 | 1 | 1 | 0 |
| Step t4 | 1 | 1 | 1 | 1 |

Fig. 5

| | A3 | A2 | A1 | A0 |
|---|---|---|---|---|
| Step t0 | 1 | 1 | 1 | 1 |
| Step t1 | 0 | 1 | 1 | 1 |
| Step t2 | 0 | 0 | 1 | 1 |
| Step t3 | 0 | 0 | 0 | 1 |
| Step t4 | 0 | 0 | 0 | 0 |

Fig. 6 — Data Bus

| | D3 | D2 | D1 | D0 |
|---|---|---|---|---|
| Step t0 | 0 | 0 | 0 | 0 |
| Step t1 | 0 | 0 | 0 | 1 |
| Step t2 | 0 | 0 | 1 | 1 |
| Step t3 | 0 | 1 | 1 | 1 |
| Step t4 | 1 | 1 | 1 | 1 |
| Step t10 | d | d | d | 0 |

Fig. 7

| | D3 | D2 | D1 | D0 |
|---|---|---|---|---|
| Step t0 | 1 | 1 | 1 | 1 |
| Step t1 | 1 | 1 | 1 | 0 |
| Step t2 | 1 | 1 | 0 | 0 |
| Step t3 | 1 | 0 | 0 | 0 |
| Step t4 | 0 | 0 | 0 | 0 |
| Step t10 | d | d | d | 1 |

Fig. 8

| | D3 | D2 | D1 | D0 |
|---|---|---|---|---|
| Step t0 | 0 | 0 | 0 | 0 |
| Step t1 | 1 | 1 | 0 | 0 |
| Step t2 | 1 | 1 | 1 | 0 |
| Step t3 | 1 | 1 | 1 | 0 |
| Step t4 | 0 | 0 | 1 | 1 |
| Step t10 | d | d | d | d |

Fig. 9

| | D3 | D2 | D1 | D0 |
|---|---|---|---|---|
| Step t0 | 1 | 1 | 1 | 1 |
| Step t1 | 0 | 1 | 1 | 1 |
| Step t2 | 0 | 1 | 1 | 1 |
| Step t3 | 0 | 0 | 0 | 0 |
| Step t4 | 0 | 0 | 0 | 0 |
| Step t10 | 1 | d | d | d |

| | | Address Bus | | | | Data Bus | | |
|---|---|---|---|---|---|---|---|---|
| | | A3 | A2 | A1 | A0 | D3 | D2 | D1 | D0 |
| Step : t0 (write) | | 0 | 0 | 0 | 0 | 0 | 0 | 0 | 0 |
| Step : t1 (write) | | 0 | 0 | 0 | (0) | 0 | 0 | 0 | 1 |
| Step : t2 (write) | | 0 | 0 | 1 | (0) | 0 | 0 | 1 | 1 |
| Step : t3 (write) | | 0 | 1 | 1 | (0) | 0 | 1 | 1 | 1 |
| Step : t4 (write) | | 1 | 1 | 1 | (0) | 1 | 1 | 1 | 1 |
| Step : t5 (read) | | 0 | 0 | 0 | 0 | 0 | 0 | 0 | (1) |
| Step : t6 (read) | | 0 | 0 | 0 | (0) | 0 | 0 | 0 | 1 |
| Step : t7 (read) | | 0 | 0 | 1 | (0) | 0 | 0 | 1 | 1 |
| Step : t8 (read) | | 0 | 1 | 1 | (0) | 0 | 1 | 1 | 1 |
| Step : t9 (read) | | 1 | 1 | 1 | (0) | 1 | 1 | 1 | 1 |
| Step : t10 (write) | | 0 | 0 | 0 | (0) | 1 | 1 | 1 | 0 |
| Step : t11 (read) | | 0 | 0 | 0 | (0) | 1 | 1 | 1 | 0 |

"Fault Case" :
Address Line A0 on "open 0"

Fig. 10

|  | Address Bus | | | | Data Bus | | | |
|---|---|---|---|---|---|---|---|---|
|  | A3 | A2 | A1 | A0 | D3 | D2 | D1 | D0 |
| Step : t0  (write) | 0 | 0 | 0 | 0 | 0 | 0 | 0 | 0 |
| Step : t1  (write) | 0 | 0 | 0 | 1 | 0 | 0 | 0 | (0) |
| Step : t2  (write) | 0 | 0 | 1 | 1 | 0 | 0 | 1 | (0) |
| Step : t3  (write) | 0 | 1 | 1 | 1 | 0 | 1 | 1 | (0) |
| Step : t4  (write) | 1 | 1 | 1 | 1 | 1 | 1 | 1 | (0) |
| Step : t5  (read)  | 0 | 0 | 0 | 0 | 0 | 0 | 0 | 0 |
| Step : t6  (read)  | 0 | 0 | 0 | 1 | 0 | 0 | 0 | (0) |
| Step : t7  (read)  | 0 | 0 | 1 | 1 | 0 | 0 | 1 | (0) |
| Step : t8  (read)  | 0 | 1 | 1 | 1 | 0 | 1 | 1 | (0) |
| Step : t9  (read)  | 1 | 1 | 1 | 1 | 1 | 1 | 1 | (0) |
| Step : t10 (write) | 0 | 0 | 0 | 1 | 1 | 1 | 1 | 0 |
| Step : t11 (read)  | 0 | 0 | 0 | 1 | 1 | 1 | 1 | 0 |

"Fault Case" :
Data Line D0 on "open 0"

Fig. 11

|  | Address Bus | | | | Data Bus | | | |
|---|---|---|---|---|---|---|---|---|
|  | A3 | A2 | A1 | A0 | D3 | D2 | D1 | D0 |
| Step : t0 (write) | 0 | 0 | 0 | (1) | 0 | 0 | 0 | 0 |
| Step : t1 (write) | 0 | 0 | 0 | 1 | 0 | 0 | 0 | 1 |
| Step : t2 (write) | 0 | 0 | 1 | 1 | 0 | 0 | 1 | 1 |
| Step : t3 (write) | 0 | 1 | 1 | 1 | 0 | 1 | 1 | 1 |
| Step : t4 (write) | 1 | 1 | 1 | 1 | 1 | 1 | 1 | 1 |
| Step : t5 (read) | 0 | 0 | 0 | (1) | 0 | 0 | 0 | (1) |
| Step : t6 (read) | 0 | 0 | 0 | 1 | 0 | 0 | 0 | 1 |
| Step : t7 (read) | 0 | 0 | 1 | 1 | 0 | 0 | 1 | 1 |
| Step : t8 (read) | 0 | 1 | 1 | 1 | 0 | 1 | 1 | 1 |
| Step : t9 (read) | 1 | 1 | 1 | 1 | 1 | 1 | 1 | 1 |
| Step : t10 (write) | 0 | 0 | 0 | 1 | 1 | 1 | 1 | 0 |
| Step : t11 (read) | 0 | 0 | 0 | 1 | 1 | 1 | 1 | 0 |

"Fault Case" :
Address Line A0 on "open 1"

Fig. 12

|  | Address Bus | | | | Data Bus | | | |
|---|---|---|---|---|---|---|---|---|
|  | A3 | A2 | A1 | A0 | D3 | D2 | D1 | D0 |
| Step : t0  (write) | 0 | 0 | 0 | 0 | 0 | 0 | 0 | ①  |
| Step : t1  (write) | 0 | 0 | 0 | 1 | 0 | 0 | 0 | 1 |
| Step : t2  (write) | 0 | 0 | 1 | 1 | 0 | 0 | 1 | 1 |
| Step : t3  (write) | 0 | 1 | 1 | 1 | 0 | 1 | 1 | 1 |
| Step : t4  (write) | 1 | 1 | 1 | 1 | 1 | 1 | 1 | 1 |
| Step : t5  (read) | 0 | 0 | 0 | 0 | <u>0</u> | <u>0</u> | <u>0</u> | ①  |
| Step : t6  (read) | 0 | 0 | 0 | 1 | <u>0</u> | <u>0</u> | <u>0</u> | <u>1</u> |
| Step : t7  (read) | 0 | 0 | 1 | 1 | <u>0</u> | <u>0</u> | <u>1</u> | <u>1</u> |
| Step : t8  (read) | 0 | 1 | 1 | 1 | <u>0</u> | <u>1</u> | <u>1</u> | <u>1</u> |
| Step : t9  (read) | 1 | 1 | 1 | 1 | <u>1</u> | <u>1</u> | <u>1</u> | <u>1</u> |
| Step : t10 (write) | 0 | 0 | 0 | 1 | 1 | 1 | 1 | ①  |
| Step : t11 (read) | 0 | 0 | 0 | 1 | <u>1</u> | <u>1</u> | <u>1</u> | ①  |

"Fault Case" :
Data Line D0 on "open 1"

Fig. 13

| Step | Data Bus D3 D2 D1 D0 | Data Bus D3 D2 D1 D0 | Data Bus D3 D2 D1 D0 | Data Bus D3 D2 D1 D0 |
|---|---|---|---|---|
| Step: t5 (read) | 0 0 0 (1) | 0 0 0 0 | 0 0 0 (1) | 0 0 0 (1) |
| Step: t6 (read) | 0 0 0 1 | 0 0 0 (0) | 0 0 0 1 | 0 0 0 1 |
| Step: t7 (read) | 0 0 1 1 | 0 0 1 (0) | 0 0 1 1 | 0 0 1 1 |
| Step: t8 (read) | 0 1 1 1 | 0 1 1 (0) | 0 1 1 1 | 0 1 1 1 |
| Step: t9 (read) | 1 1 1 1 | 1 1 1 (0) | 1 1 1 1 | 1 1 1 1 |
| Step: t11 (read) | 1 1 1 0 | 1 1 1 0 | 1 1 1 0 | 1 1 1 (1) |
| | Address Line A0 on "open 0" | Data Line D0 on "open 0" | Address Line A0 on "open 1" | Data Line D0 on "open 1" |

|  | | A5 | A4 | A3 | A2 | A1 | A0 | D3 | D2 | D1 | D0 |
|---|---|---|---|---|---|---|---|---|---|---|---|
| Step : t0 | (write) | d | d | 0 | 0 | 0 | 0 | 0 | 0 | 0 | 0 |
| Step : t1 | (write) | d | d | 0 | 0 | 0 | 1 | 0 | 0 | 0 | 1 |
| Step : t2 | (write) | d | d | 0 | 0 | 1 | 1 | 0 | 0 | 1 | 1 |
| Step : t3 | (write) | d | d | 0 | 1 | 1 | 1 | 0 | 1 | 1 | 1 |
| Step : t4 | (write) | d | d | 1 | 1 | 1 | 1 | 1 | 1 | 1 | 1 |
| Step : t5 | (read) | d | d | 0 | 0 | 0 | 0 | $\underline{0}$ | $\underline{0}$ | $\underline{0}$ | $\underline{0}$ |
| Step : t6 | (read) | d | d | 0 | 0 | 0 | 1 | $\underline{0}$ | $\underline{0}$ | $\underline{0}$ | $\underline{1}$ |
| Step : t7 | (read) | d | d | 0 | 0 | 1 | 1 | $\underline{0}$ | $\underline{0}$ | $\underline{1}$ | $\underline{1}$ |
| Step : t8 | (read) | d | d | 0 | 1 | 1 | 1 | $\underline{0}$ | $\underline{1}$ | $\underline{1}$ | $\underline{1}$ |
| Step : t9 | (read) | d | d | 1 | 1 | 1 | 1 | $\underline{1}$ | $\underline{1}$ | $\underline{1}$ | $\underline{1}$ |
| Step : t10 | (write) | d | d | 0 | 0 | 0 | 1 | 1 | 1 | 1 | 0 |
| Step : t11 | (read) | d | d | 0 | 0 | 0 | 1 | $\underline{1}$ | $\underline{1}$ | $\underline{1}$ | $\underline{0}$ |
| Step : t12 | (write) | 0 | 0 | d | d | d | d | d | d | 0 | 0 |
| Step : t13 | (write) | 0 | 1 | d | d | d | d | d | d | 0 | 1 |
| Step : t14 | (write) | 1 | 1 | d | d | d | d | d | d | 1 | 1 |
| Step : t15 | (read) | 0 | 0 | d | d | d | d | $\underline{d}$ | $\underline{d}$ | $\underline{0}$ | $\underline{0}$ |
| Step : t16 | (read) | 0 | 1 | d | d | d | d | $\underline{d}$ | $\underline{d}$ | $\underline{0}$ | $\underline{1}$ |
| Step : t17 | (read) | 1 | 1 | d | d | d | d | $\underline{d}$ | $\underline{d}$ | $\underline{1}$ | $\underline{1}$ |

"Good Case" Example 2

Fig. 16

|  | | D5 | D4 | D3 | D2 | D1 | D0 | A3 | A2 | A1 | A0 |
|---|---|---|---|---|---|---|---|---|---|---|---|
| Step : t0 | (write) | d | d | 0 | 0 | 0 | 0 | 0 | 0 | 0 | 0 |
| Step : t1 | (write) | d | d | 0 | 0 | 0 | 1 | 0 | 0 | 0 | 1 |
| Step : t2 | (write) | d | d | 0 | 0 | 1 | 1 | 0 | 0 | 1 | 1 |

"Good Case" Example 3

| Step | | Address Bus | | | | | | | | | Data Bus | | | |
|---|---|---|---|---|---|---|---|---|---|---|---|---|---|---|
| | | A8 | A7 | A6 | A5 | A4 | A3 | A2 | A1 | A0 | D3 | D2 | D1 | D0 |
| Step : t0 | (write) | d | d | d | d | d | 0 | 0 | 0 | 0 | 0 | 0 | 0 | 0 |
| Step : t1 | (write) | d | d | d | d | d | 0 | 0 | 0 | 1 | 0 | 0 | 0 | 1 |
| Step : t2 | (write) | d | d | d | d | d | 0 | 0 | 1 | 1 | 0 | 0 | 1 | 1 |
| Step : t3 | (write) | d | d | d | d | d | 0 | 1 | 1 | 1 | 0 | 1 | 1 | 1 |
| Step : t4 | (write) | d | d | d | d | d | 1 | 1 | 1 | 1 | 1 | 1 | 1 | 1 |
| Step : t5 | (read) | d | d | d | d | d | 0 | 0 | 0 | 0 | 0 | 0 | 0 | 0 |
| Step : t6 | (read) | d | d | d | d | d | 0 | 0 | 0 | 1 | 0 | 0 | 0 | 1 |
| Step : t7 | (read) | d | d | d | d | d | 0 | 0 | 1 | 1 | 0 | 0 | 1 | 1 |
| Step : t8 | (read) | d | d | d | d | d | 0 | 1 | 1 | 1 | 0 | 1 | 1 | 1 |
| Step : t9 | (read) | d | d | d | d | d | 1 | 1 | 1 | 1 | 1 | 1 | 1 | 1 |
| Step : t10 | (write) | d | d | d | d | d | 0 | 0 | 0 | 1 | 1 | 1 | 1 | 0 |
| Step : t11 | (read) | d | d | d | d | d | 0 | 0 | 0 | 1 | 1 | 1 | 1 | 0 |
| Step : t12 | (write) | d | 0 | 0 | 0 | 0 | d | d | d | d | 0 | 0 | 0 | 0 |
| Step : t13 | (write) | d | 0 | 0 | 0 | 1 | d | d | d | d | 0 | 0 | 0 | 1 |
| Step : t14 | (write) | d | 0 | 0 | 1 | 1 | d | d | d | d | 0 | 0 | 1 | 1 |
| Step : t15 | (write) | d | 0 | 1 | 1 | 1 | d | d | d | d | 0 | 1 | 1 | 1 |
| Step : t16 | (write) | d | 1 | 1 | 1 | 1 | d | d | d | d | 1 | 1 | 1 | 1 |
| Step : t17 | (read) | d | 0 | 0 | 0 | 0 | d | d | d | d | 0 | 0 | 0 | 0 |
| Step : t18 | (read) | d | 0 | 0 | 0 | 1 | d | d | d | d | 0 | 0 | 0 | 1 |
| Step : t19 | (read) | d | 0 | 0 | 1 | 1 | d | d | d | d | 0 | 0 | 1 | 1 |
| Step : t20 | (read) | d | 0 | 1 | 1 | 1 | d | d | d | d | 0 | 1 | 1 | 1 |
| Step : t21 | (read) | d | 1 | 1 | 1 | 1 | d | d | d | d | 1 | 1 | 1 | 1 |
| Step : t22 | (write) | 0 | d | d | d | d | d | d | d | d | d | d | d | 0 |
| Step : t23 | (write) | 1 | d | d | d | d | d | d | d | d | d | d | d | 1 |
| Step : t24 | (read) | 0 | d | d | d | d | d | d | d | d | d | d | d | 0 |
| Step : t25 | (read) | 1 | d | d | d | d | d | d | d | d | d | d | d | 1 |

"Good Case" Example 4

Fig. 17

|  | Address Bus | | | | | | Data Bus | | | |
|---|---|---|---|---|---|---|---|---|---|---|
|  | A5 | A4 | A3 | A2 | A1 | A0 | D3 | D2 | D1 | D0 |
| Step : t12 (write) | 0 | 0 | d | d | d | d | d | d | 0 | 0 |
| Step : t13 (write) | 0 | 0 | d | d | d | d | d | d | 0 | 1 |
| Step : t14 (write) | 1 | 0 | d | d | d | d | d | d | 1 | 1 |
| Step : t15 (read) | 0 | 0 | d | d | d | d | d | d | 0 | 1 |
| Step : t16 (read) | 0 | 0 | d | d | d | d | d | d | 0 | 1 |
| Step : t17 (read) | 1 | 0 | d | d | d | d | d | d | 1 | 1 |

"Fault Case":
Address Line A4 on "open 0"

Fig. 18

|  | Address Bus | | | | | | Data Bus | | | |
|---|---|---|---|---|---|---|---|---|---|---|
|  | A5 | A4 | A3 | A2 | A1 | A0 | D3 | D2 | D1 | D0 |
| Step : t12 (write) | 0 | 1 | d | d | d | d | d | d | 0 | 0 |
| Step : t13 (write) | 0 | 1 | d | d | d | d | d | d | 0 | 1 |
| Step : t14 (write) | 1 | 1 | d | d | d | d | d | d | 1 | 1 |
| Step : t15 (read) | 0 | 1 | d | d | d | d | d | d | 0 | 1 |
| Step : t16 (read) | 0 | 1 | d | d | d | d | d | d | 0 | 1 |
| Step : t17 (read) | 1 | 1 | d | d | d | d | d | d | 1 | 1 |

"Fault Case":
Address Line A4 on "open 1"

Fig. 19

|  | Address Bus | | | | | | Data Bus | | | |
| --- | --- | --- | --- | --- | --- | --- | --- | --- | --- | --- |
|  | A5 | A4 | A3 | A2 | A1 | A0 | D3 | D2 | D1 | D0 |
| Step : t12 (write) | 0 | 0 | d | d | d | d | d | d | 0 | 0 |
| Step : t13 (write) | 0 | 1 | d | d | d | d | d | d | 0 | 1 |
| Step : t14 (write) | (0) | 1 | d | d | d | d | d | d | 1 | 1 |
| Step : t15 (read) | 0 | 0 | d | d | d | d | d̲ | d̲ | 0̲ | 0̲ |
| Step : t16 (read) | 0 | 1 | d | d | d | d | d̲ | d̲ | (1̲) | 1̲ |
| Step : t17 (read) | (0) | 1 | d | d | d | d | d̲ | d̲ | 1̲ | 1̲ |

"Fault Case" :
Address Line A5 on "open 0"

Fig. 20

|  | Address Bus | | | | | | Data Bus | | | |
| --- | --- | --- | --- | --- | --- | --- | --- | --- | --- | --- |
|  | A5 | A4 | A3 | A2 | A1 | A0 | D3 | D2 | D1 | D0 |
| Step : t12 (write) | (1) | 0 | d | d | d | d | d | d | 0 | 0 |
| Step : t13 (write) | (1) | 1 | d | d | d | d | d | d | 0 | 1 |
| Step : t14 (write) | 1 | 1 | d | d | d | d | d | d | 1 | 1 |
| Step : t15 (read) | (1) | 0 | d | d | d | d | d̲ | d̲ | 0̲ | 0̲ |
| Step : t16 (read) | (1) | 1 | d | d | d | d | d̲ | d̲ | (1̲) | 1̲ |
| Step : t17 (read) | 1 | 1 | d | d | d | d | d̲ | d̲ | 1̲ | 1̲ |

"Fault Case" :
Address Line A5 on "open 1"

Fig. 21

METHOD FOR TESTING BUS CONNECTIONS OF WRITABLE AND READABLE INTEGRATED ELECTRONIC CIRCUITS, IN PARTICULAR MEMORY COMPONENTS

CROSS-REFERENCE TO RELATED APPLICATION

This application is a continuation of copending International Application No. PCT/EP98/06673, filed Oct. 21, 1998, which designated the United States.

BACKGROUND OF THE INVENTION

Field of the Invention

The invention relates to a method for testing bus connections of electronic circuits, in particular memory components.

Finely structured printed circuit boards, hybrid configurations and, increasingly, multichip modules as well can be used to form highly miniaturized configurations of electronic and electrical components. A multichip module is a configuration in which a plurality of chip modules without cases or housings make contact with one another through the use of a base or carrier. In this case, chip modules are frequently used which represent large-scale-integrated, writable, electronic circuits. Such chip modules are connected at least via an address bus and a data bus to further electronic circuits, for example to processors or to chip modules of the same type. The latter case occurs in particular when the chip modules are memory modules, for example so-called RAMs. Storage elements or storage cells in the interior of a chip module can be addressed through the use of the address bus such that information which is generally binary-coded, that is to say a so-called data item, can be written via the data bus to a cell, and can be read from it. A silicon substrate or a printed circuit board, for example, may be used as the base for the at least one chip module, which in some cases may have no case. Such a construction can be accommodated in a housing or case which, as a rule, has a large number of external electrical connecting contacts which are used for data interchange.

In practice, it has been found that, when constructing finely structured configurations, faults occur in particular when making electrical contacts between a chip module (which, for example, has no case) and a base or the conductors on the base. Faults thus occur, in particular, in the soldered or bonded joints which are required in this case. On the other hand, in order to carry out a connection test, it is generally presupposed that the chip module itself and its base substrate are free of faults, since they have generally been tested separately, in advance. The faults which are possible when a contact-making connection is produced between a chip module and a base may be of different types. A first fault type is referred to as a "stuck-at" fault and relates to a connection like a short-circuit between an address bus line and data bus line. In this case, a so-called "stuck-at 0" or "stuck-at 1" fault relates to a connection from an address bus line or data bus line to ground or to a voltage potential. A second fault type, which is called a "bridging" fault, relates to connections between more than two address bus lines or data bus lines. Finally, a third fault type is referred to as an "open" fault. In this case, an address bus line or data bus line has a discontinuity, such as a disconnection. A so-called "open 0" or "open 1" fault occurs depending on the nature of the line discontinuity, if the potential which occurs on the line is comparable to the level for logic zero or the level for logic one.

Such faults result in a disturbance in the data flow between an affected chip module and an electronic circuit containing this chip module. Faults in lines and contact connections on the base which are part of a data bus or address bus, that is to say the bus connections of a writable and readable integrated electronic circuit, are particularly problematic in this case. With finely structured configurations, such as a multichip module, it is thus necessary to check the connections between the base and the electronic circuit, in particular for the presence of discontinuities.

It is known, for example, for so-called "in circuit" tests to be used to test the connections on the surfaces of printed circuit boards. In this case, special needles or test probes are used to make external contact with selected points on the printed circuit board or with connections with electronic components located on it. This allows signals which occur during operation of the electrical circuit located on a printed circuit board to be tapped off, and to be evaluated in connected, special test apparatuses. However, owing to the small dimensions, this technique cannot be used to test, for example, multichip modules or finely structured printed circuit boards. For this reason, electronic test methods frequently have to be used for such configurations. In this case, selected bit patterns are written to input connections of an electronic circuit, which are present as standard connections and are correspondingly easily accessible. The bit patterns which occur as a reaction to this at further output connections, which are likewise present as standard and are easily accessible, can be evaluated in order to detect, in particular, short-circuits and discontinuities. A test apparatus can be connected easily, for example, if the address and data bus of an electronic circuit is accessible from outside, for example via a plug connector, or if, for example, a memory module which has no case is fitted on a base and there are easily accessible contact points for the lines of the address and data bus on the base surface.

When electronic test methods are used, a fundamental problem which occurs is that a fault on a line of the data bus of the electronic circuit to be tested can indeed be detected by writing and subsequently reading back a pattern of selected test bits. However, using this technique, it is not possible to detect a fault on a line of the associated address bus. In such a case, the test bit pattern is written to a memory cell in the electronic circuit whose address does however not match the respective predetermined address details, owing to the fault which is present. However, when read back, the test bit pattern is once again read from the same memory cell, although this is "incorrect" with respect to the present address details, without any address bus fault appearing to have occurred in this process.

For this reason, special test bit patterns must be used in order to also allow the detection of a fault (caused, in particular by a discontinuity) on the address bus of a writable and readable integrated electronic circuit.

The publication by C. Maxfield, entitled "Testing RAMs and ROMs"; EDN; Feb. 1, 1996, pages 153 to 160, discloses an electronic method for testing connections, for example of memory modules. In this case, a sequence of test bit patterns is written to the lines of the buses of a memory module, and this sequence may be referred to as a "walking-ones sequence" or else a March-0/1 algorithm. In this case, each line of the external address and data buses (which generally have a width of several bits) of a memory module is stimulated once, selectively, with the logic 1 level in a rising or falling sequence, while the other lines of the address or data bus are operated at the logic 0 level. By way of example, for a data bus which has a width of four bits and has the data bits D3, D2, D1, D0, this results in the combinations 0,0,0,0; 0,0,0,1; 0,0,1,0; 0,1,0,0 and 1,0,0,0 as test bit patterns.

This method has the disadvantage that a relatively large number of write and read accesses are required in order to detect faults. For example, 64 write accesses and 64 read accesses are normally required for an 8-bit wide address bus and a 1-bit-wide data bus. A reduction to 22 may be possible, but only for the write access. Nevertheless, this still requires 86 memory accesses overall. In contrast, when using the method according to the invention, only 34 memory accesses are required in this example, that is to say 17 write accesses and 17 read accesses, in order to detect and localize possible discontinuities in the address or data bus.

A further electronic test method for the connections of, for example, memory modules is described in the publication by F. d. Jong and A. J. d. L. van Wijngaarden entitled "Memory interconnect test at board level", published in the 23rd IEEE International Test Conference; 1992; pages 328–337. This test also has the disadvantage that a relatively large number of write and read accesses are required to the cells of a memory to be tested in order to identify all the possible fault patterns which occur when there are discontinuities in the connections, and to allow the associated lines to be detected. Thus, with this electronic test method, two write accesses and one read access to the memory module are required to check each line of the address bus, that is to say each address line and, in addition, one write access and one read access to the memory module are required to check each line of the data bus, that is to say each data line. In order to cover all possible fault patterns for discontinuities in connections, this method thus also requires a considerable number of memory accesses.

The textbook by M. Gerner, B. Muller and G. Sandweg entitled "Selbsttest digitaler Schaltungen" [Self-test of digital circuits], R. Oldenbourg Publishers, Munich, Vienna 1990, pages 221 to 224, describes a so-called "RAM self-test with deterministic test patterns." The method is based on the principle that the respective address of a memory cell is also written as a data word to the memory cell. In this case, the associated address is first of all written, in an initialization phase, word-by-word, to each memory word. This is followed by a read cycle with a nominal/actual value comparison and up to four further runs, which are referred to as phases 1 to 4. In this case, inverted and non-inverted, rising and falling address sequences are written as data values to each individual cell in the memory, are read back and are compared. The method admittedly allows a large number of fault types, which are possible in the interior of memories, to be identified, such as stuck-at faults, one-directional coupling effects and short-circuits but, on the other hand, requires a very large number of write and read memory accesses in a plurality of successive test runs.

SUMMARY OF THE INVENTION

It is accordingly an object of the invention to provide a method for testing the bus connections of writable and readable integrated electronic circuits which overcomes the above-mentioned disadvantages of the heretofore-known testing methods of this general type and which is in particular suited for testing the external connections of, for example, SRAM (static random access memory), DRAM (dynamic random access memory) or flash-memory modules which are used, for example without cases, on a printed circuit board or a multichip module.

With the foregoing and other objects in view there is provided, in accordance with the invention, a method for checking contact connections of a writable and readable integrated electronic circuit, in particular a memory component, connected to an address bus and a data bus. The method includes the steps of:

A) writing, in at least a first sequence of write steps, address bit test patterns step-by-step to an address bus, and writing data bit test patterns on a data bus into a writable and readable integrated electronic circuit;

B) writing, in at least a first sequence of read steps, the address bit test patterns again step-by-step to the address bus, and reading associated data bit patterns on the data bus from the writable and readable integrated electronic circuit;

C) comparing, in at least a first sequence of test steps, the associated data bit patterns with the data bit test patterns, in particular by pattern comparison with address and data bit fault patterns, and, in the event of discrepancies, localizing a faulty line on one of the address bus and the data bus; and D) selecting the address bit test patterns and the data bit test patterns such that,
   i) in a respective first step in one of the first sequence of write steps and read steps, bits in the address bit test pattern have a first, matching binary value,
   ii) in the first step of the first sequence of write steps, bits in the data bit test pattern have a second, matching binary value, and
   iii) for each following step in one of a respective sequence of write steps and read steps, starting with one of a lowest-value bit and a highest-value bit in one of the address bit test pattern and the data bit test pattern, a respective adjacent bit is assigned a respective complementary binary value with respect to a preceding step, until,
   iv) in a final step in one of the respective sequence of write steps and read steps, all bits in one of the address bit test pattern and the data bit test pattern, have a binary value complementary to the first, matching binary value and the second, matching binary value, respectively.

In other words, the method according to the invention is used for checking the contact connections of a writable and readable integrated electronic circuit, in particular of a memory module, on an address bus and a data bus. In this case, in at least one first sequence of write steps, selected address bit test patterns are written step-by-step to the address bus, and selected data bit test patterns on the data bus are written to the circuit. Then, in at least one first sequence of read steps, the selected address bit test patterns are in turn written step-by-step to the address bus, and the associated data bit patterns on the data bus are read from the circuit. In at least one first sequence of test steps, the read data bit patterns are then compared with the selected data test bit patterns and, in the event of discrepancies, the faulty line on the address bus or data bus is localized, in particular by pattern comparison with address and data bit fault patterns.

According to the invention, the address and data bit test patterns are selected such that, in a first step in the first sequence of write and read steps, the bits in the address bit test pattern have a first, matching binary value, and in the first step of the first sequence of write steps, the bits in the data bit test pattern have a second, matching binary value. For each following step in the respective sequence of write and read steps, starting with the lowest-value or highest-value bit in the address or data bit test pattern, the respective adjacent bit is assigned the respective complementary binary value to the preceding step, until, in a final step in the sequence of write or read steps, all the bits in the address and data bit test patterns, respectively, have a binary value which is complementary to the respective first step.

The method according to the invention offers the advantage that it is not only possible to detect the occurrence of a fault, but also to locate the fault location precisely with a minimal number of data bit test patterns that need to be written and read back. It is thus possible to detect the respective faulty connection between a connection of the address bus or data bus of an electronic circuit and, in particular, a base substrate, for example a printed circuit board. Even if the purpose of such a method is to localize the respective faulty bit on one line of the address bus or data bus, and the nature of the fault is thus of secondary importance, the method according to the invention is thus particularly suitable for localization of the fault location of so-called "open 0" and "open 1" fault types, as well as so-called "stuck-at 0" and "stuck-at 1" faults when checking individual modules.

In accordance with another mode of the invention, in order to check the bits on the address bus and on the data bus which have a value which is greater than the value of the respective highest-value bit on the data bus or on the address bus, at least one second sequence of write, read and test steps is carried out and, in the process, selected address and data bit test patterns are written to those bits on the address or data bus, respectively, which have the greater value, and to those adjacent bits on the data or address bus, respectively, which have already had address or data bit test patterns, respectively, written to them in the first sequence of write, read and test steps, and whose number, starting with the respective lowest-value or highest-value bit in this group, corresponds to the number of bits with the greater value.

In accordance with yet a further mode of the invention, following the first sequence of write, read and test steps, a respective additional write and read and test step is carried out for the same address and data bus bits, and, in the process, at least the data bit test pattern is selected such that, in the additional write step, at least the bit in the data bit test pattern has the same binary value as that bit in the data bit test pattern whose binary value in the second write step was complementary to that in the first write step.

Other features which are considered as characteristic for the invention are set forth in the appended claims.

Although the invention is illustrated and described herein as embodied in method for testing the bus connections of writable and readable integrated electronic circuits, in particular of memory modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

The invention will be explained in more detail with reference to exemplary embodiments which are illustrated in the figures, which are described briefly below and in which:

BRIEF DESCRIPTION OF THE DRAWINGS:

FIG. 1 is a sequence of test bit patterns according to the invention for the situation where there are no faults on the address bus and data bus lines, illustrated using the example of an address bus and a data bus, which are both 4 bits wide;

FIGS. 2 to 5 are further sequences of address bit test patterns that are possible according to the invention, illustrated using the example of address buses, which are each 4 bits wide;

FIGS. 6 to 9 are further sequences of data bit test patterns that are possible according to the invention, illustrated using the example of data buses, which are each 4 bits wide;

FIG. 10 is a sequence of test bit patterns according to the invention for the situation where there is an "open 0" fault on the address line A0 of the address bus, illustrated using the example of an address bus and a data bus, which are both 4 bits wide;

FIG. 11 is a sequence of test bit patterns according to the invention for the situation where there is an "open 0" fault on the data line D0 of the data bus, illustrated using the example of an address bus and a data bus, which are both 4 bits wide;

FIG. 12 is a sequence of test bit patterns according to the invention for the situation where there is an "open 1" fault on the address line A0 of the address bus, illustrated using the example of an address bus and a data bus, which are both 4 bits wide;

FIG. 13 is a sequence of test bit patterns according to the invention for the situation where there is an "open 1" fault on the data line D0 of the data bus, illustrated using the example of an address bus and a data bus, which are both 4 bits wide;

FIG. 14 is a comparison chart of the fault patterns which occur in the examples in FIGS. 10, 11, 12, and 13 on the data lines of the respective data buses;

FIG. 15 is a sequence of test bit patterns according to the invention for the situation where there are no faults on the address bus and data bus lines, illustrated using the example of an address bus which is 6 bits wide and a data bus which is 4 bits wide;

FIG. 16 is a start of a sequence of test bit patterns according to the invention for the situation where there are no faults on the address bus and data bus lines, illustrated using the example of a data bus which is 6 bits wide and an address bus which is 4 bits wide;

FIG. 17 is a sequence of test bit patterns according to the invention for the situation where there are no faults on the address bus and data bus lines, illustrated using the example of an address bus which is 9 bits wide and a data bus which is 4 bits wide;

FIG. 18 is a section of a sequence of test bit patterns according to the invention for the situation where there is an "open 0" fault on the address line A4 of the address bus, illustrated using the example of an address bus which is 6 bits wide and a data bus which is 4 bits wide;

FIG. 19 is a section of a sequence of test bit patterns according to the invention for the situation where there is an "open 1" fault on the address line A4 of the address bus, illustrated using the example of an address bus which is 6 bits wide and a data bus which is 4 bits wide;

FIG. 20 is a section of a sequence of test bit patterns according to the invention for the situation where there is an "open 0" fault on the address line A5 of the address bus, illustrated using the example of an address bus which is 6 bits wide and a data bus which is 4 bits wide; and FIG. 21 is a section of a sequence of test bit patterns according to the invention for the situation where there is an "open 1" fault on the address line A5 of the address bus, illustrated using the example of an address bus which is 6 bits wide and a data bus which is 4 bits wide.

DESCRIPTION OF THE PREFERRED EMBODIMENTS

Referring now to the figures of the drawings in detail and first, particularly, to FIGS. 1, 2 to 5 and 6 to 9 thereof, there are shown test bit patterns for the method according to the invention. In this case, FIG. 1 shows a so-called good case using the example of an address bus and data bus which are each 4 bits wide, that is to say a sequence of test bit patterns according to the invention for the situation where there are no faults on the address bus and data bus lines.

In the illustrated example, only five write steps t0 to t4 are required, followed by five read steps t5 to t9 in order to make it possible to confirm that there are no faults in the connections of an electronic memory module which has an address bus and a data bus which are each 4 bits wide. In the situation where a so-called fault pattern has been detected in this case, it may be advantageous, according to an advantageous, further embodiment of the invention, to carry out a further read step and write step. These are illustrated in the example in FIG. 1 in the form of the write step t10 and the read step t11 in order to explain the principle of the invention, although they are not absolutely essential per se, in the present "good case." The advantages that are achieved with the in each case one additional write step and read step will be explained in more detail in the following text with reference to the examples illustrated in FIGS. 10 to 14 and the fault patterns that occur in this case. On the other hand, for reasons of simplicity, it is readily possible in practice to carry out the additional write step and read step in any situation irrespective of whether the preceding steps in the test method according to the invention can be associated with a "good case" or a "fault case."

According to the invention, in the example in FIG. 1, an address bit test pattern is written, in the first step t0 of the sequence of write steps, to the four bits A0, A1, A2, A3 of the address bus, so that all the bits have the same binary value, in the example in FIG. 1 the value 0000. Furthermore, an address bit test pattern is written, in the first step t0 in the sequence of write steps, to the four bits D0, D1, D2, D3 of the data bus, so that all the bits likewise have the same binary value, likewise 0000 in the example of FIG. 1. In other embodiments, which are also explained in the following text with reference to the example in FIGS. 2 to 9, other values may also be preset in the first step t0.

According to the invention, for each following step in the sequence of write steps t1, t2, t3, starting with the lowest-value or highest-value bit in the address or data bit test pattern, the respective adjacent bit is assigned the respective complementary binary value to the preceding step, until, in the last step t4 in the sequence of write steps, all the bits A0, A1, A2, A3 and D0, D1, D2, D3, respectively, of the address bus and data bus have a value which is complementary to that of the respective first step t0. In the example in FIG. 1, this means that the address bit test patterns 0001, 0011, 0111 are passed to the address bus, and the data bit test pattern 0001, 0011, 0111 are passed to the data bus, in the write steps t1, t2, t3. The combination 1111 then occurs as the address and data bit test pattern in the last write step t4.

This is followed by a sequence of read steps t5 to t9. In this case, the address bit test patterns which are output on the address bus in the individual read steps correspond to the address bit test patterns which are output in the preceding write steps t0 to t4. In this way, the data bit test patterns which have been written to the cells addressed through the use of the address bit test patterns in the electronic circuit are to be read once again. The read data bit patterns D0, D1, D2, D3 of the data bus which indicate the read result in the sequence of read steps t5 to t9 are underscored in FIG. 1. In the same way, data bit patterns which occur as the read result in the at least one sequence of read steps on the data bus are denoted by underscores in all the following figures.

In a further sequence of test steps, the read data bit patterns are now compared with the data bit test patterns written to the electronic circuit in the preceding sequence of write steps. If such a comparison results in any discrepancies between the data bit patterns and the data bit test patterns, then the respective faulty line on the address bus or data bus can be localized, in particular through the use of a so-called pattern comparison. A pattern comparison makes use of address and data bit fault patterns. These represent a library of possible fault patterns from whose occurrence it is possible to deduce that a defect has occurred on a specific line in the address bus or data bus. If at least one data bit pattern which has been read and differs from a written data bit fault pattern can now be assigned to a stored address or data bit fault pattern, then it is possible to localize the associated faulty address bus line or data bus line.

In the example of FIG. 1, this is also followed by an additional write step t10, an additional read step t11 and a test step. As has already been explained above, these are not required per se in the example in FIG. 1, since this is a so-called "good case". This means that the data bit patterns detected in the sequence of read steps t5 to t9 on the data bus are identical to the data bit test patterns written in the sequence of write steps t0 to t4. Since there are thus no faults in the connections of an electronic circuit, in particular of a memory module, to such an address bus and data bus, the steps t10, t11 are admittedly unnecessary but, in practice, they are frequently carried out in order to simplify the test procedure.

The data bit test pattern in write step t10 is in this case selected according to the invention such that at least the bit of the data bit test pattern has the same binary value as that bit in the data bit test pattern whose binary value in the second write step was the complement of that in the first write step. In the example in FIG. 1, this results, in the additional write step t10, in the bit D0 in the data bit test pattern having the same binary value 0 as the bit D0 in the data bit test pattern in the first write step t1, since its binary value has been formed as a complement of that in the second write step t2. Further embodiments for this additional write and read step are explained using the example of FIGS. 6 to 9.

Using the method according to the invention, all the connections for each memory module can be tested in a preferred manner for the presence of, in particular, possible discontinuities. In the process, faults can not only be detected but can also be clearly localized. The method according to the invention is distinguished in particular by the fact that, with only a comparatively small number of write and read steps, a correspondingly small number of address and data bit test patterns are required. Furthermore, the method according to the invention allows short-circuits between address lines and between data lines to be detected and localized, in particular if the widths of the address bus and data bus match. Particularly if the address bus and data bus widths differ, it may be advantageous for a short-circuit measurement to be carried out on a small number of selected lines, or on all the lines, before using the method according to the invention.

FIGS. 2 to 5 use the example of address buses which are each 4 bits wide and have the bits A0, A1, A2, A3, and a first sequence of write steps t0 to t4, to show further sequences of address bit test patterns which are possible according to the invention. In FIG. 2, the values of the address bit test pattern are 0000 in the first step, 0001, 0011, 0111 in the following steps, and 1111 in the last step. In FIG. 3, the values of the address bit test pattern are 1111 in the first step, 1110, 1100, 1000 in the following steps, and 0000 in the last step. In FIG. 4, the values of the address bit test pattern are 0000 in the first step, 1000, 1100, 1110 in the following steps, and 1111 in the last step. In FIG. 5, the values of the address bit test pattern are 1111 in the first step, 0111, 0011, 0001 in the following steps, and 0000 in the last step.

FIGS. 6 to 9 likewise use the example of data buses which are each 4 bits wide and have the bits D0, D1, D2, D3, and a first sequence of write steps t0 to t4 including the additional write step t10, to show further sequences of data bit test patterns which are possible according to the invention. In FIG. 6, the values of the data bit test pattern are 0000 in the first step, 0001, 0011, 0111 in the following steps, and 1111 in the last step. In this case, at least the data bit D0 should have the value 0 in the step t10, while the values of the other bits D1, D2, D3 may be chosen as required, as is symbolized by the identification "d". In FIG. 7, the values of the data bit test pattern are 1111 in the first step, 1110, 1100, 1000 in the following steps, and 0000 in the last step. In this case, at least the data bit D0 should have the value 1 in the step t10, while the values of the other bits D1, D2, D3 may be chosen as required, as is symbolized by the identification "d". In FIG. 8, the values of the data bit test pattern are 0000 in the first step, 1000, 1100, 1110 in the following steps, and 1111 in the last step. In this case, at least the data bit D3 should have the value 0 in step t10, while the values of the other bits D0, D1, D2 may be chosen as required, as is symbolized by the identification "d". In FIG. 9, the values of the data bit test pattern are 1111 in the first step, 0111, 0011, 0001 in the following steps, and 0000 in the last step. In this case, at least the data bit D3 should have the value 1 in the step t10, while the values of the other bits D0, D1, D2 may be chosen as required, as is symbolized by the identification "d".

It is now possible without any further problems to combine as required the sequences of address bit test patterns which are shown on the one hand in FIGS. 2 to 5 with the sequences of data bit test patterns which are shown in FIGS. 6 to 9, for a test procedure. For example, in this way, it is possible for address bit test patterns illustrated in FIG. 3 to be written to the address bus of a memory module to be tested, in a first sequence of write and read steps, and for the data bit test patterns illustrated in FIG. 8 to be written in the associated sequence of write steps. Furthermore, the method according to the invention can also be used for items under test whose address and data buses are of any width. This will be explained in more detail in the following text with reference to FIGS. 15 to 21.

The following FIGS. 10 to 14, which each use the example of an address bus which is 4 bits wide and a data bus which is 4 bits wide, will be used to explain sequences of test bit patterns according to the invention for the situation where one of the lines of the address bus or data bus is faulty. By way of example, the already explained "open 0" and "open 1" are illustrated as fault types.

FIG. 10 thus shows a sequence of test bit patterns according to the invention for the situation where the address line A0 of the address bus has an "open 0" fault. The discrepancies from the "good case" shown in FIG. 1 which occur in the values on the lines A0, D0 of the address and data bus in the individual write and read steps and are caused by faults are annotated by circles. Thus, on the basis of the assumed "open 0" fault on this line, A0 remains at the binary value 0 in the steps t1 to t4 and t6 to t11, instead of assuming the value 1. This means that the same memory cell is addressed, incorrectly, in steps t0, t1 and t5,t6. The data bit test pattern 0001 is thus written to this cell in step t1, thus overwriting the data bit test pattern 0000 written to it in the preceding step t0. This situation is detected in particular in read step t5, since the data bit pattern 0001 is read in this case, instead of the data bit pattern 0000. The sequence of data bit patterns detected in the read steps t5 to t9 and t11, and their discrepancy from the "good case" in FIG. 1, that is to say the fault pattern that occurs in this case, is characteristic of a fault on the address bus line A0. This can be detected in a sequence of test steps, for example by pattern comparison of the detected data bit patterns with a library of data bit fault patterns.

Furthermore, FIG. 11 shows a sequence of test bit patterns according to the invention for the situation where the data line D0 of the data bus has an "open 0" fault. The discrepancies which occur in the values on the line D0 of the data bus in individual write and read steps and are caused by faults are annotated by circles in comparison with the "good case" in FIG. 1. Owing to the assumed "open 0" fault on this line, D0 remains at the binary value 0 in steps t1 to t4 and t6 to t9, instead of assuming the value 1. This means that data bit test patterns 0000, 0010, 0110, 1110 are written incorrectly to the respective addressed cells in steps t1 to t4, instead of the data bit test patterns 0001, 0011, 0111, 1111. This situation is detected in particular in read steps t5 to t9 and t11. The consequence of the data bit patterns detected in the read steps t5 to t9 and t11, and their discrepancy from the "good case" in FIG. 1, that is to say the fault pattern which occurs in this case, is characteristic of a fault on the data bus line D0. This can be detected in a sequence of test steps, for example by pattern comparison of the detected data bit test pattern with a library of data bit fault patterns.

Furthermore, FIG. 12 shows a sequence of test bit patterns according to the invention for the situation where the address line A0 of the address bus has an "open 1" fault. The discrepancies which occur in the values on the lines A0, D0 of the address bus and data bus in individual write and read steps and are caused by faults are annotated by circles in comparison with the "good case" in FIG. 1. Owing to the assumed "open 1" fault on this line, A0 remains at the binary value 1 in steps t0 and t5, instead of assuming the value 0. This means that the same memory cell is addressed incorrectly in steps t0, t1 and t5,t6 and t10, t11. The data bit test pattern 0001 is thus written to this cell in step t1 and, in consequence, the data bit test pattern 0000 written in the preceding step t0 is overwritten. This process is detected in particular in read step t5 since the data bit pattern 0001 is read in this case, instead of the data bit pattern 0000. The sequence of data bit patterns detected in the read steps t5 to t9 and t11 and their discrepancy from the "good case" in FIG. 1, that is to say the fault pattern which occurs in this case, is characteristic of a fault on the address bus line A0. This can be detected in a sequence of test steps, for example by pattern comparison of the detected data bit test pattern with a library of data bit fault patterns.

Furthermore, FIG. 13 shows a sequence of test bit patterns according to the invention for the situation where the data line D0 of the data bus has an "open 1" fault. The discrepancies which occur in the values on the line D0 of the data bus in individual write and read steps and are caused by faults are annotated by circles in comparison with the "good case" in FIG. 1. Owing to the assumed "open 1" fault on this line, D0 remains at the binary value 1 in steps t5, t10 and t11, instead of assuming the value 0. This means that the data bit test patterns 0001 and 1111 are written incorrectly to the respective addressed cells, instead of the data bit test patterns 0000 and 1110, in steps t0 and t10. This process is detected in particular in read steps t5 and t11. The sequence of data bit patterns detected in the read steps t5 to t9 and t11 and their discrepancy from the "good case" in FIG. 1, that is to say the fault pattern which occurs in this case, is characteristic of a fault on the data bus line D0. This can be detected in a sequence of test steps, for example by pattern comparison of the detected data bit test pattern with a library of data bit fault patterns.

Finally, FIG. 14 shows a summary of the fault patterns I, II, III, IV which are detected, in the examples in FIGS. 10, 11, 12, 13, in the form of data bit patterns read in the steps t5 to t9 and t11. As can be seen, the data bit patterns in the four cases are different. Thus, in a sequence of test steps, it is possible to identify unambiguously the line affected by the fault irrespective of what fault type is present, that is to say irrespective of whether an "open 0", "open 1", "stuck-at 0" or "stuck-at 1" fault is present. This line is now accessible for repair.

The method according to the invention makes it possible, of course, to identify and unambiguously to localize faulty connections in the same way in the other address and data lines A1, A2, A3 and D1, D2, D3 as well, in the address and data buses shown in the examples in FIGS. 1 to 14.

Furthermore, the method according to the invention can be applied without restriction in particular to writable memory modules having address and data buses which have different bus widths. This will be explained in more detail in the following text with reference to the examples illustrated in FIGS. 15 to 21. FIGS. 15, 16, 17 thus show examples of so-called "good cases" of address and data buses having different bus widths, that is to say address and data buses having lines without faults. In this case FIG. 15 uses the example of an address bus which has a width of 6 bits and a data bus which has a width of 4 bits, FIG. 16 uses the example of a data bus which has a width of 6 bits and an address bus which has a width of 4 bits, and FIG. 17 uses the example of an address bus which has a width of 9 bits and a data bus which has a width of 4 bits, to show a sequence of address and data bit test patterns according to the invention, in each case.

In the example in FIG. 15, the address bus has the bits A0, A1 to A5, and the data bus has the bits D0, D1 to D3. The address bus thus has a greater bus width than the data bus. In the test method according to the invention, address and data bit test patterns are written in a first sequence of write steps t0 to t4, first of all to all the bits D0 to D3 of the data bus and to those bits of the address bus which have values corresponding to the bits of the data bus, that is to say the bits A0 to A3. This is then followed by a sequence of read steps t5 to t9, during which the same selection of bits on the address and data buses are accessed as in the preceding write steps. This is then advantageously also followed by an additional write step t10 and an additional read step t11.

Those bits of the address bus which have a value which is greater than the value of the highest-value on the data bus, the address bit A4, A5 in the example in FIG. 15, are not yet considered in this phase of the test. In FIG. 15, they are thus annotated by a "d", that is to say a "don't care" symbol. Any desired binary value is thus used. It is advantageous for these values to be permanently predetermined once in each of the write steps t0 to t4 and to be kept constant, in particular at least for the following read steps t5 to t9.

Up to and including step t11, the method sequence corresponds to the example of FIG. 1 and will thus not be explained once again. If no fault pattern can be identified by this stage, then the bits A0 to A3 and D0 to D3 have been tested, and may be regarded as having no faults.

According to the invention, at least one second sequence of write, read and test steps is now carried out in order to check bits on the address and data buses whose value is greater than the value of the respective highest-value bit on the data bus or address bus. Since, in the example in FIG. 15, the address bus has a value which is greater than that of the data bus, the address bits A4 and A5 still need to be checked. To do this, it is necessary to use a second sequence of write steps t12, t13, t14, a second sequence of read steps t15, t16, t17, and a sequence of test steps.

In this case, address and data bit test patterns selected in accordance with the invention are written to those bits of the address and data bus which have the greater value. Furthermore, address and data bit test patterns selected in accordance with the invention are written to those adjacent bits of the data and address bits to which address and data bit test patterns have already been written in the first sequence of write, read and test steps, and the number of which, starting with the respective lowest-value or highest-value bit in this group, corresponds to the number of bits having the greater value. In the example in FIG. 15, this means that, in the write steps t12, t13, t14, address bit test patterns are written to the bits A4, A5 of the address bus, and data bit test patterns are written to the bits D0, D1 of the data bus. Since the other bits have already been tested, their binary value is irrelevant, as is symbolized once again in FIG. 15 by "d" identifications.

The same bits on the address bus and data bus are accessed in subsequent read steps t15, t16. After this, it is possible to check in a further sequence of test steps whether any fault patterns have occurred. These can then be compared, in particular, with data bit test patterns in order to localize a possible fault to one of the address lines A0, A1. The test of the bits A4, A5 is comparable with the situation in which the address bus and data bus have a matching word width, that is to say a width of two with the bits Ay, Az, Dy, Dz in the example in FIG. 15.

In the example in FIG. 16, the data bus has a width of 6 bits, and the address bus 4 bits. Since the test method is in this case carried out largely in a comparable manner to that for the situation illustrated in FIG. 15, only the first three write steps t0, t1, t2 are shown as an extract, in FIG. 16, for reasons of simplicity.

Finally, FIG. 17 shows a further sequence of address and data bit test patterns according to the invention, using the example of an address bus which has a width of 9 bits with the bits A0 to A8, and a data bus which has a width of 4 bits with the bits D0 to D3. Once again, the sequence of the test method in steps t0 to t11 corresponds to the example in FIG. 1. In these sequences of write, read and test steps, the bits A0 to A3 of the address bus and the bits D0 to D3 of the data bus are checked. The bits A4 to A8 of the address bus having a greater value are not yet considered in this phase, and are once again set to "d" in FIG. 17. If there are no faults in bits A0 to A3 and D0 to D3 of the address bus and data bus, this is first of all followed by a second sequence of write steps t12 to t16, a second sequence of read steps t17 to t21, and a second sequence of test steps. In this case, address and data bit test patterns selected in accordance with the invention are written to the address bits A4 to A7 in order to test these bits, and to the bits D0 to D3 of the data bus, in order to test them, in a manner corresponding to the previous explanations. The bit A8 of the address bus having the greater value is not yet considered in this phase. Furthermore, the already tested bits A0 to A3 of the address bus are no longer considered in this phase. All these bits are thus likewise annotated by "d" in FIG. 17. If there are no faults in the bits A4 to A7 of the address bus, this is followed by a final sequence of two write steps t22, t23, a final sequence of two read steps t24, t25, and a final sequence of test steps. These are used to test the highest-value address bits A8. In this case, the bits D1 to D3 and A0 to A7 are annotated by "d" in FIG. 17, since they have already been tested in the preceding steps.

Finally, FIGS. 18 to 21 each use the example of an address bus which has a width of 6 bits and a data bus which has a width of 4 bits to show the tests on those address lines which have a value which is greater than the value of highest-value bit D3 on the data bus. In FIGS. 18 to 21, these are the address bits A4, A5, which are tested through the use of a second sequence of write steps t12, t13, t14 and a second sequence of read steps t15, t16, t17. In this case, it is assumed that the address bits A0 to A3 and the data bits D0 to D3 are respectively tested in a first sequence of read, write and test steps and have no faults. These first sequences correspond to the steps t0 to t11 in the examples shown, for example, in FIGS. 1 and 15, and thus do not need to be explained once again.

In the examples shown in FIGS. 18 to 21, it is assumed that there is a fault on the line associated with one of the two address bits A4 or A5 or in its connection to the associated electronic circuit. By way of example, the already explained "open 0" and "open 1" faults are selected once again as fault types. Furthermore, the discrepancies which occur on the bits on the lines A4, A5, D0, D1 of the address bus and data bus during individual write and read steps and are caused by faults are once again annotated by circles in comparison with the "good case" illustrated, for example, in FIG. 1.

FIG. 18 thus shows a section of a sequence of test bit patterns according to the invention for the situation where the address line A4 of the address bus has an "open 0" fault. Owing to the assumed fault on this line, A4 thus remains at the binary value 0, instead of assuming the value 1, in steps t13, t14 and t16, t17. This means that the same memory cell is addressed incorrectly in steps t12, t13 and t15, t16. The data bit test pattern dd01 is thus written to this cell in the step t13 and, in consequence, the data bit test pattern dd00 written in the preceding step t12 is overwritten. This process is detected in particular in the read step t15 since, in this case, the data bit pattern dd01 is read instead of the data bit pattern dd00. The sequence of data bit patterns detected in the read steps t15 to t17, and their discrepancy from the "good case", for example in FIG. 1, that is to say the fault pattern which occurs in this case, is characteristic of a fault on the address bus line A4. This can be detected in a sequence of test steps, for example by pattern comparison of the detected data bit patterns with a library of data bit fault patterns.

Furthermore, FIG. 19 shows a section of a sequence of test bit patterns according to the invention for the situation where the address line A4 of the address bus has an "open 1" fault. Owing to the assumed fault on this line, A4 thus remains at the binary value 1, instead of assuming the value 0, in steps t12 and t15. This also means that the same memory cell is addressed incorrectly in steps t12, t13 and t15, t16. The data bit test pattern dd01 is thus written to this cell in the step t13 and, in consequence, the data bit test pattern dd00 written in the preceding step t12 is overwritten. This process is detected in particular in the read step t15 since, in this case, the data bit pattern dd01 is read instead of the data bit pattern dd00. The sequence of data bit patterns detected in the read steps t15 to t17, and their discrepancy from the "good case", for example in FIG. 1, that is to say the fault pattern which occurs in this case, is likewise characteristic of a fault on the address bus line A4.

Furthermore, FIG. 20 shows a section of a sequence of test bit patterns according to the invention for the situation where the address line A5 of the address bus has an "open 0" fault. Due to the assumed fault on this line, A5 thus remains at the binary value 0, instead of assuming the value 1, in steps t14 and t17. This has the result that the same memory cell is addressed incorrectly in steps t13, t14 and t16, t17. The data bit test pattern dd11 is thus written to this cell in the step t14 and, in consequence, the data bit test pattern dd01 written in the preceding step t13 is overwritten. This process is detected in particular in the read step t16 since, in this case, the data bit pattern dd11 is read instead of the data bit pattern dd01. The sequence of data bit patterns detected in the read steps t15 to t17, and their discrepancy from the "good case", for example in FIG. 1, that is to say the fault pattern which occurs in this case, is characteristic of a fault on the address bus line A5.

Finally, FIG. 21 shows a section of a sequence of test bit patterns according to the invention for the situation where the address line A5 of the address bus has an "open 1" fault. Due to the assumed fault on this line, A5 thus remains at the binary value 1, instead of assuming the value 0, in steps t12, t13 and t15, t16. This has the result that the same memory cell is addressed incorrectly in steps t13, t14 and t16, t17. The data bit test pattern dd11 is thus written to this cell in the step t14 and, in consequence, the data bit test pattern dd01 written in the preceding step t13 is overwritten. This process is detected in particular in the read step t16 since, in this case, the data bit pattern dd11 is read instead of the data bit pattern dd01. The sequence of data bit patterns detected in the read steps t15 to t17, and their discrepancy from the "good case", for example in FIG. 1, that is to say the fault pattern which occurs in this case, is characteristic of a fault on the address bus line A5.

For the situation which occurs frequently in practice, where the address bus has a width which is greater than or equal to the width of the data bus, the number AN of write and read accesses to the circuit to be tested which are required for use of the method according to the invention can be determined using the relationship $$AN=2\{ABB+1\}+2+0 \text{ for } ABB=DBB$$

$$AN=2\{ABB+1\}+2+2 \text{ for } DBB<ABB\leq 2DBB$$

$$AN=2\{ABB+1\}+2+4 \text{ for } 2DBB<ABB<3DBB$$

where ABB=address bus width

DBB=data bus width.

In the situation DBB≧ABB, that is to say the data bus has a width which is greater than or equal to the width of the address bus, the factors DBB and ABB must be interchanged in the above equations.

We claim:

1. A method for checking contact connections of a writable and readable integrated electronic circuit connected to an address bus and a data bus, the method which comprises:

A) writing, in at least a first sequence of write steps, address bit test patterns step-by-step to an address bus, and writing data bit test patterns on a data bus into a writable and readable integrated electronic circuit;

B) writing, in at least a first sequence of read steps, the address bit test patterns again step-by-step to the address bus, and reading associated data bit patterns on the data bus from the writable and readable integrated electronic circuit;

C) comparing, in at least a first sequence of test steps, the associated data bit patterns with the data bit test patterns and, in the event of discrepancies, localizing a faulty line on one of the address bus and the data bus; and D) selecting the address bit test patterns and the data bit test patterns such that,
   i) in a respective first step in one of the first sequence of write steps and read steps, bits in the address bit test pattern have a first, matching binary value,
   ii) in the first step of the first sequence of write steps, bits in the data bit test pattern have a second, matching binary value, and
   iii) for each following step in one of a respective sequence of write steps and read steps, starting with one of a lowest-value bit and a highest-value bit in one of the address bit test pattern and the data bit test pattern, a respective adjacent bit is assigned a respective complementary binary value with respect to a preceding step, until,
   iv) in a final step in one of the respective sequence of write steps and read steps, all bits in one of the address bit test pattern and the data bit test pattern, have a binary value complementary to the first, matching binary value and the second, matching binary value, respectively.

2. The method according to claim 1, which comprises checking bits on one of the address bus and the data bus having a value greater than a value of a respective highest-value bit of one of the data bus and the address bus, by A) carrying out at least one second sequence of write, read and test steps and, in the process, B) writing one of an address bit test pattern and a data bit test pattern
   i) to the bits on one of the address bus and the data bus having the value greater than the value of the respective highest-value bit, and
   ii) to adjacent bits on one of the data bus and address bus, the adjacent bits having
      a) already had one of address and data bit test patterns written to them in the first sequence of write, read and test steps, and
      b) having a number, starting with one of a lowest-value bit and a highest-value bit in a group, the number corresponding to a number of the bits having the value greater than the value of the respective highest-value bit of one of the data bus and the address bus.

3. The method according to claim 1, which comprises:

subsequent to the first sequence of write, read and test steps, carrying out a respective additional write step, read step and test step for the bits on the address bus and the data bus; and selecting a data bit test pattern such that, in the additional write step, at least a first given bit in the data bit test pattern has the same binary value as a second given bit in the data bit test pattern, the second given bit in the data bit test pattern having a binary value in a second write step complementary to a binary value in the first write step.

4. The method according to claim 1, which comprises using a memory component as the writable and readable integrated electronic circuit.

5. The method according to claim 1, which comprises comparing the associated data bit patterns with the data bit test patterns by pattern comparison with address and data bit fault patterns.

* * * * *